United States Patent [19]

Pritchett

[11] Patent Number: 5,302,916
[45] Date of Patent: Apr. 12, 1994

[54] WIDE RANGE DIGITAL FREQUENCY DETECTOR

[75] Inventor: Robert L. Pritchett, East Allen Township, Northampton County, Pa.

[73] Assignee: AT&T Bell Laboratories, Murray Hill, N.J.

[21] Appl. No.: 992,882

[22] Filed: Dec. 21, 1992

[51] Int. Cl.⁵ .............................................. H03L 7/00
[52] U.S. Cl. .................................. 331/1 A; 331/11; 331/17; 331/27; 307/514; 307/526; 328/134
[58] Field of Search ...................... 331/1 A, 11, 17, 25, 331/27; 307/514, 525, 526; 328/133, 134, 155

[56]           References Cited
           U.S. PATENT DOCUMENTS

| | | | |
|---|---|---|---|
| 3,271,688 | 9/1966 | Gschwind et al. | 331/25 X |
| 3,562,661 | 2/1971 | Crumb et al. | 331/25 X |
| 3,824,483 | 7/1974 | Margala et al. | 331/1 A |
| 3,825,855 | 7/1974 | Basset et al. | 331/1 A |
| 4,017,806 | 4/1977 | Rogers | 331/1 A |
| 4,077,016 | 2/1978 | Sanders et al. | 331/4 |
| 4,151,463 | 4/1979 | Kibler | 324/82 |
| 4,151,485 | 4/1979 | La Fratta | 331/1 A |
| 4,456,890 | 6/1984 | Carickhoff | 331/1 A |
| 4,590,440 | 5/1986 | Haque et al. | 331/17 |
| 4,902,920 | 2/1990 | Wolaver | 307/514 |
| 4,929,918 | 5/1990 | Chung et al. | 331/10 |
| 5,168,245 | 12/1992 | Koskowich | 331/1 A |

FOREIGN PATENT DOCUMENTS 0199448 10/1986 European Pat. Off. ............. 331/25
3130156 2/1983 Fed. Rep. of Germany ...... 307/525

*Primary Examiner*—Robert J. Pascal
*Assistant Examiner*—Arnold Kinkead
*Attorney, Agent, or Firm*—David L. Smith

[57]                ABSTRACT

An integrated circuit for generating an oscillator clock signal based on a reference clock signal includes a wide band digital frequency detector. The wide band digital frequency detector includes a first shift register clocked by the reference clock signal and a second shift register clocked by the oscillator clock signal. A third shift register receives as an input the output from the first shift register and is clocked by the output of the second shift register. The third shift register provides a first oscillator control output. A fourth shift register receives a phase of the reference clock signal as an input and is clocked by the oscillator clock signal to provide a second oscillator control output. In an alternate embodiment, the first oscillator control output is coupled as the up-down control input of an up-down counter and the second oscillator control output is coupled as the clock input to the up-down counter to control the oscillator clock frequency.

14 Claims, 2 Drawing Sheets

WIDE RANGE DIGITAL FREQUENCY DETECTOR

TECHNICAL FIELD

This invention relates generally to integrated circuits having a frequency detector and particularly to integrated circuits having a wide range digital frequency detector.

BACKGROUND OF THE INVENTION

Phase and frequency locked loops are used concurrently in the control of an oscillator to expand a clock signal or generate a high frequency clock signal based on a reference clock signal. The frequency locked loop adjusts the frequency of operation of the oscillator as a coarse adjustment to oscillator operation. The phase locked loop provides a finer adjustment of the operation of the oscillator to align a characteristic feature, typically a leading rising edge, of the oscillator generated clock signal with the same characteristic of the reference clock signal.

The frequency locked loop and phase locked loop have independently sensed operation of the oscillator and also have independently adjusted operation of the oscillator. Since the frequency locked loop and phase locked loop independently sense operation of the oscillator, inconsistent indications of the status of the oscillator are possible. The corrective action taken by the two loops in response to the sensed inconsistent indications tries to adjust the frequency of operation of the oscillator in opposite directions until the oscillator operates at equilibrium. In this mode of operation, a condition known as false locking, the oscillator operates at a stable frequency that is not the desired frequency. False locking is a result of sensing the operation of the phase locked loop using one detector and sensing the operation of the frequency locked loop using a different detector.

Additionally, the frequency detectors previously used in the control of frequency locked loops had a very limited range of accuracy, beyond which incorrect assessment of relative frequency of the reference clock signal and the oscillator generated clock signal could be wrong more than half of the time.

It would be desirable to sense operation of the phase locked loop and operation of the frequency locked loop using the same detector to eliminate the potential discrepancy introduced by sensing operation of the phase locked loop and frequency locked loop by different sensors, and simultaneously provide a frequency detector with a wider range of accuracy.

SUMMARY OF THE INVENTION

In accordance with an embodiment of the invention, an integrated circuit for generating an oscillator clock signal based on a reference clock signal includes a first shift register clocked by the reference clock signal and a second shift register clocked by the oscillator clock signal. A third shift register receives as an input the output from the first shift register and is clocked by the output of the second shift register. The third register provides a first oscillator control output. A fourth shift register receives a phase of the reference clock signal as an input and is clocked by the oscillator clock signal to produce a second oscillator control output. In an alternate embodiment, the first oscillator control output is coupled as the up-down control input of an up-down counter and the second oscillator control output is coupled as the clock input to the up-down counter to control the oscillator.

DETAILED DESCRIPTION

Figure 3:
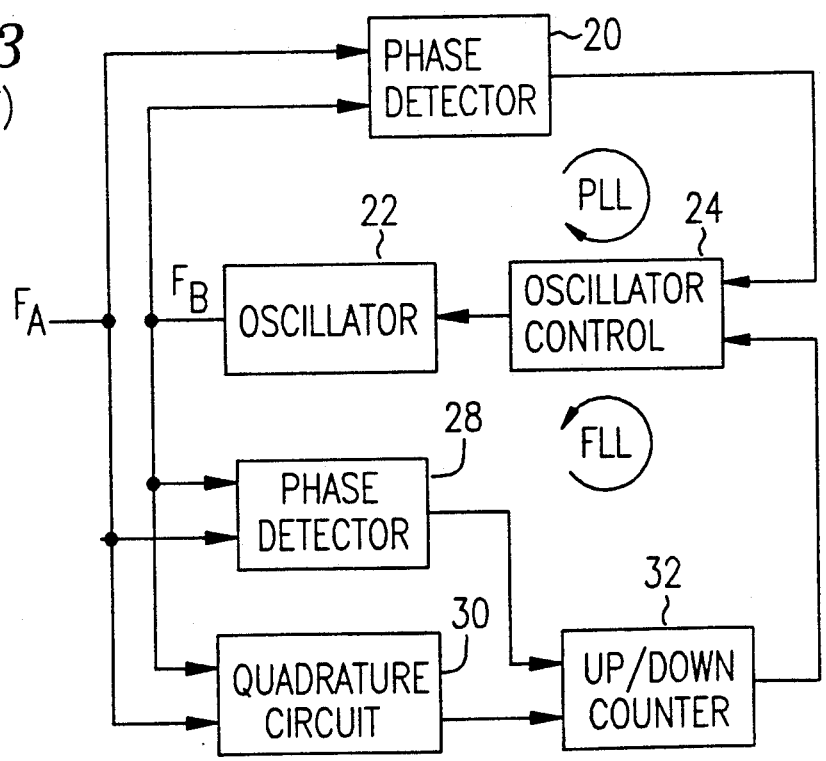
FIG. 3 is a schematic diagram showing a prior art phase locked loop and frequency locked loop oscillator control circuit, having separate sensors for each of the phase locked loop and frequency locked loop circuits.

The improvement will be better appreicated by initially reviewing a prior art configuration of a frequency locked loop (FLL) and a phase locked loop (PLL) controlling operation of an oscillator as shown in the simplified schematic diagram of FIG. 3. Signal $F_A$ represents the input reference clock signal and signal $F_B$ represents the oscillator clock signal generated by oscillator 22. The phase locked loop comprises phase detector 20, oscillator 22, and oscillator control 24. The reference clock signal $F_A$ provides a first input to phase detector 20. The oscillator clock signal $F_B$ provides a second input to phase detector 20. The output of phase detector 20 is input to oscillator control 24.

The frequency locked loop comprises phase detector 28, quadrature circuit 30, up-down counter 32, oscillator control 24, and oscillator 22. The reference clock signal $F_A$ provides a first input to phase detector 28. The oscillator clock signal $F_B$ provides a second input to phase detector 28. The output of the phase detector provides a first input to up-down counter 32. The reference clock signal $F_A$ and oscillator clock signal $F_B$ provide first and second inputs to quadrature circuit 30, the output of which provides the second input to up-down counter 32. The output of up-down counter 32 is applied to oscillator control 24.

Since the phase locked loop and frequency locked loop independently sense the operation of oscillator 22 and independently control operation of oscillator 22, under the limited circumstances described above, there could be a conflict in the direction of control each loop tries to impose on oscillator 22.

Figure 1:
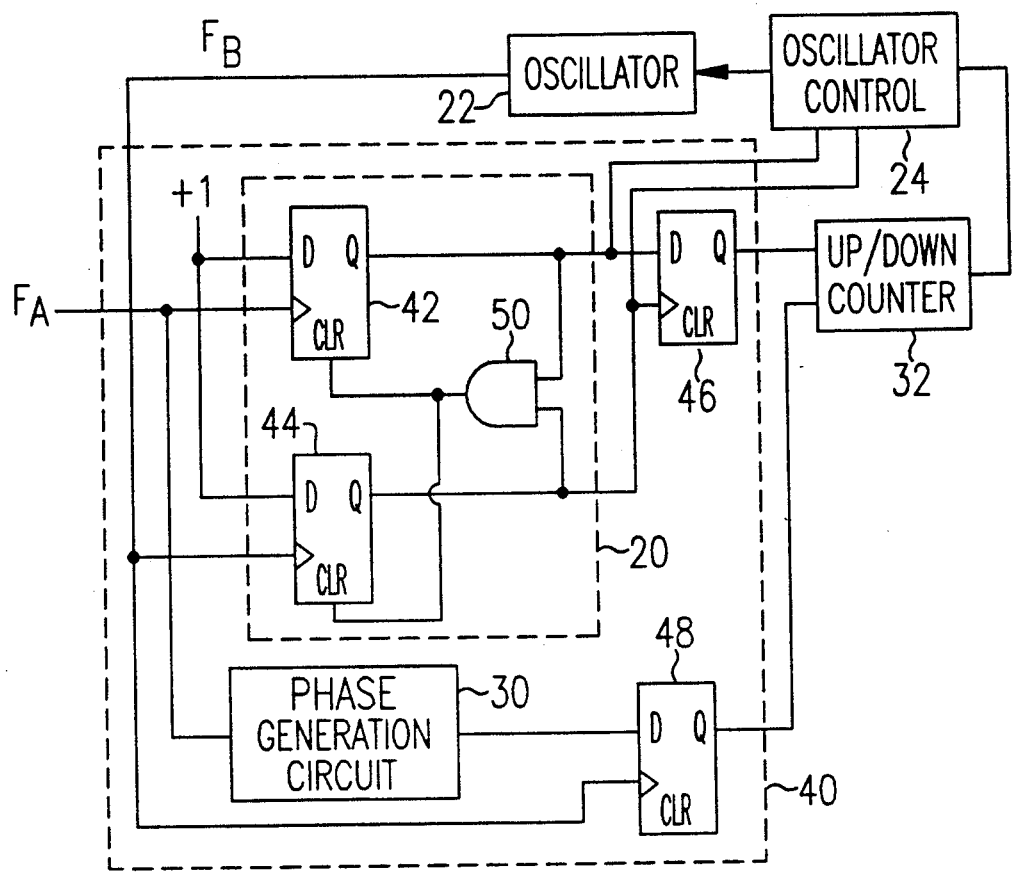
FIG. 1 is a schematic diagram illustrating an embodiment of the wide band digital frequency detector in a configuration of a frequency locked loop and a phase locked loop controlling the operation of an oscillator.

A wide band digital frequency detector circuit 40 is shown schematically in FIG. 1 in an improved oscillator control circuit in accordance with one embodiment of the invention. Flip-flops 42, 44, 46, and 48 function as one stage shift registers, and preferably are D-type flip-flops. Phase detector circuit 20 includes flip-flops 42 and 44 along with AND gate 50 configured as a well-known phase detector. The D-inputs to flip-flops 42 and 44 are coupled to the supply voltage so as to remain at the level of a logic one designated "+1" in FIG. 1. The reference clock signal $F_A$ is coupled to the clock input of flip-flop 42. The Q output of flip-flop 42 is coupled to the D-input of flip-flop 46, to a first input of AND gate 50, and also as an input to oscillator control 24. The oscillator clock signal $F_B$ is coupled to the clock input of flip-flop 44. The Q output from flip-flop 44 is coupled as the clock input of flip-flop 46, as a second input to AND gate 50, and also as an input to oscillator control 24 to complete the phase locked loop. The output of AND gate 50 is coupled to the clear input of both flip-flops 42 and 44. The output from flip-flop 46 is coupled as the up-down control line of up-down counter 32.

The reference clock signal $F_A$ is also coupled as the input to a phase generation circuit 30 that preferably generates a quadrature phase. The output of phase generation circuit 30 is coupled to the D-input of flip-flop 48. Flip-flop 48 is clocked by the oscillator clock signal $F_B$. The output of flip-flop 48 is coupled to the clock input of up-down counter 32. The output of up-down counter 32 is coupled as an input to oscillator control 24, which in turn is coupled to and controls oscillator 22, to complete the frequency locked loop. While the shift registers and up-down counter 32 are depicted as separate from oscillator control 24, it is understood that the shift registers and up-down counter are part of the oscillator control function. Since the shift registers and up-down counter do not represent the entirety of the oscillator control function, oscillator control 24 is included to more completely represent the oscillator control function.

In operation, oscillator 22 is part of a frequency synthesizer or other system to produce an oscillator clock signal $F_B$ to replicate the reference clock signal $F_A$. At any point in time, one of the two signals may have an instantaneous frequency that is slightly greater than or slightly less than the other signal. From the frequency and phase difference between the two signals, oscillator control is derived. Wide band digital frequency detector circuit 40 is employed over a wide range of frequencies to digitally determine when the frequency of the reference clock signal $F_A$ is greater than or less than the frequency of the oscillator generated clock signal and to generate a control signal for application to oscillator 22.

Wide band frequency detector circuit 40 receives the reference clock signal $F_A$ at the clock input of flip-flop 42 and the oscillator generated clock signal $F_B$ at the clock input of flip-flop 44. Phase detector circuit 20 detects the relative timing of the positive leading edge transitions of signals $F_A$ and $F_B$ as a means of determining which direction control action should take. When the positive leading edge transition of the reference clock signal $F_A$ occurs prior in time to a positive leading edge transition of oscillator clock signal $F_B$, a logic one is clocked to the output of flip-flop 42. The subsequent occurrence of a positive leading edge transition of oscillator clock signal $F_B$ initiates a logic one being clocked to the output of flip-flop 44. With the output of both flip-flops 42 and 44 high, the output of AND gate 50 transitions from low to high with the result that flip-flops 42 and 44 are cleared. Phase detector circuit 20 is thereby reset and ready to detect the first to occur of the next subsequent leading edge transitions of signals $F_A$ and $F_B$.

In this manner, the flip-flop 42 or 44 that has as its input the lower frequency signal will have an output that is a series of very short pulses. This occurs because the lower frequency input will always be the later-to-arrive leading edge transition. The flip-flop 42 or 44 that has as its input the higher frequency signal of $F_A$ or $F_B$ will have an output that is a series of variably longer pulses, in the case of an open loop, up to the duration of the higher frequency signal.

Figure 2:
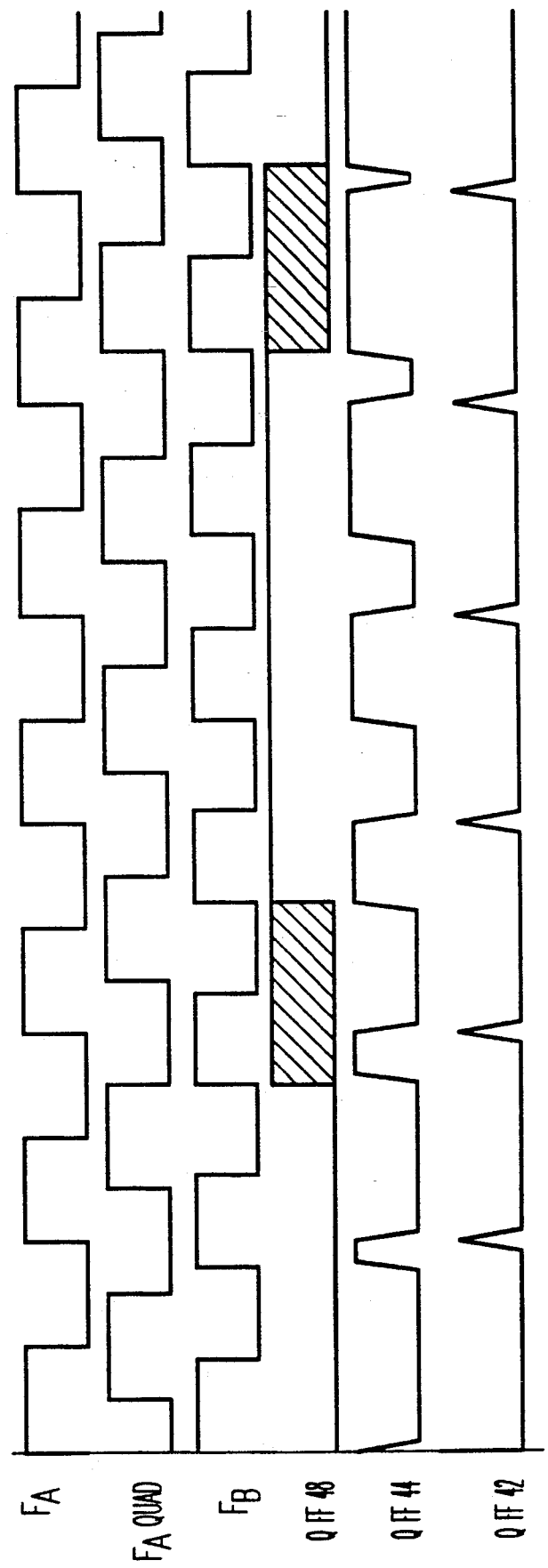
FIG. 2 is a graphical diagram showing a typical reference clock signal, oscillator clock signal, and shift register output signals.

The operation of phase detector circuit 20, without feedback through oscillator 22, is illustrated in FIG. 2 where the frequency of the oscillator clock signal $F_B$ is slightly greater than the frequency of the reference clock signal $F_A$. The output from flip-flop 44 is shown as a sequence of variably longer pulses. The sequence would be repetitive under the conditions of no corrective action by feedback through oscillator 22. The output from flip-flop 42 is a series of short, uniformly-spaced pulses at the frequency of the lower frequency signal, the reference clock signal $F_A$. When the frequency of the oscillator clock signal $F_B$ is slightly greater than the frequency of the reference clock signal $F_A$, the desired response from oscillator control 24 is to reduce the frequency of the oscillator clock signal $F_B$ to be the same frequency as the reference clock signal $F_A$. Under these conditions, the output of flip-flop 46 remains low except on the rare occurrence when the rising leading edge of the two clock signals $F_A$ and $F_B$ occur simultaneously, in which case it cannot be guaranteed that the output of flip-flop 46 will transition high. Similarly, the output of flip flop 48 is undetermined when the rising leading edge of signal $F_B$ occurs simultaneously with a transition of signal $F_A$ QUAD. This undetermined state will only last for one cycle of signal $F_B$. Clocking up-down counter 32 when the up-down control line is low, will cause the counter to count down, concomitantly decreasing the frequency of the oscillator clock signal $F_B$ as a corrective action.

Conversely, when the frequency of oscillator clock signal $F_B$ is slightly lower than the frequency of the reference clock signal $F_A$, the desired response from oscillator control 24 is to increase the frequency of the oscillator clock signal $F_B$ to be the same frequency as the reference clock signal $F_A$. The operation of circuit 52, without feedback through oscillator 22, would provide an output from flip-flop 44 that is a series of short pulses at the frequency of oscillator clock signal $F_B$. The output of flip-flop 42 is a series of variably longer pulses. Under these conditions, each time the flip-flop 44 output clocks flip-flop 46, the output of flip-flop 46 goes high or remains high. Maintaining the up-down control line of up-down counter 32 high permits up-down counter 32 to count up, concomitantly increasing the oscillator clock signal $F_B$ as a corrective action.

When the frequency of signals $F_A$ and $F_B$ are identical, no control action is required. The output of flip-flop 48 does not transition. As a result, the clocking of up-down counter 32 ceases and the frequency of signal $F_B$ is maintained at the same frequency as reference clock signal $F_B$. From this steady state operation, it can be appreciated that either the reference clock signal may be passed through a phase generation circuit as shown in FIG. 1, or equivalently the oscillator clock signal $F_B$ may be passed through a phase generation circuit.

Phase generation circuit 30 generates a phase of the reference clock signal, preferably the quadrature phase, and provides the phase as the input to a shift register, such as D flip-flop 48. Flip-flop 48 is clocked by the oscillator clock signal $F_B$. The output of flip-flop 48 is coupled to provide the clock signal to up-down counter 32. Up-down counter 32 is clocked when the output of flip-flop 48 transistions from low to high. Upon receiving a low to high transition on the clock input, up-down counter 32 counts up or down to control the oscillator frequency, depending upon the logic level of the up-down control input.

Oscillators operate over frequencies extending beyond an octave. The frequency range limitations of the prior art frequency detectors are not present in this wide range frequency detector.

Those skilled in the art can easily implement the wide band digital frequency detector circuit in silicon.

While the invention has been described as being implemented by an integrated circuit, it is recognized that other embodiments of the invention could be software implemented such as in a microprocessor. Although the invention has been described as an integrated circuit, the invention could be part of a system such as a frequency synthesizer, microcomputer, or other microprocessor based system. The shift registers in the disclosed embodiment of the invention have been described as being clocked by a signal having a rising leading edge. Those skilled in the art can modify the disclosed circuit to accommodate a shift register clocked by a falling leading edge. Furthermore, although the invention has been described as useful in a clock expansion application where it is desired to replicate a reference clock signal, those skilled in the art could readily adapt the invention to an application where a signal having a frequency that is a multiple of the reference clock frequency is generated.

I claim:

1. An integrated circuit for generating an oscillator clock signal based on a reference clock signal, comprising:
   a first shift register clocked by the reference clock signal, the first shift register providing a first shift register output;
   a second shift register clocked by the oscillator clock signal, the second shift register providing a second shift register output;
   a third shift register for receiving as an input the first shift register output and for receiving the second shift register output as a clock signal, the third shift register providing a third shift register output;
   a fourth shift register for receiving a phase of the reference clock signal as an input and for receiving the oscillator clock signal as a clock signal, the fourth shift register providing a fourth shift register output, whereby the third shift register output and fourth shift register output are utilized to control the oscillator clock signal.

2. An integrated circuit as recited in claim 1, further comprising:
   an AND gate for receiving as inputs the first shift register output and the second shift register output, the AND gate providing an output to clear at least one of said first and second shift registers.

3. An integrated circuit as recited in claim 1, further comprising:
   an up-down counter for receiving the third shift register output as an up-down control input and for receiving the fourth shift register output as a clock signal, the up-down counter providing a counter output for controlling the oscillator.

4. An integrated circuit as recited in claim 3, further comprising an oscillator, the oscillator for receiving the counter output and for generating the oscillator clock signal in response thereto.

5. A method of controlling an oscillator, comprising the steps:
   clocking a first shift register by a reference clock signal;
   clocking a second shift register by an oscillator generated clock signal;
   coupling the output of the first shift register to the input of a third shift register;
   clocking the third shift register by the output from the second shift register;
   coupling a phase of the reference clock signal as an input to a fourth shift register;
   clocking the fourth shift register by the oscillator generated clock signal;
   providing the output of the third shift register as an up-down control input to an up-down counter; and
   providing the output of the fourth shift register as a clock signal to an up-down counter, whereby the up-down counter counts up or down in response to the state of the up-down control input when the up-down counter is clocked, to control the frequency of the oscillator.

6. A method as recited in claim 5, further comprising the steps of:
   coupling the output of each of the first and second shift registers as inputs to an AND gate; and
   coupling the output of the AND gate to clear at least one of the first and second shift registers.

7. A system for generating an oscillator clock signal based on a reference clock signal, the system including a frequency synthesizer comprising:
   a first shift register clocked by the reference clock signal, the first shift register providing a first shift register output;
   a second shift register clocked by the oscillator clock signal, the second shift register providing a second shift register output;
   a third shift register for receiving as an input the first shift register output and for receiving the second shift register output as a clock signal, the third shift register providing a third shift register output;
   a fourth shift register for receiving a phase of the reference clock signal as an input and for receiving the oscillator clock signal as a clock signal, the fourth shift register providing a fourth shift register output, whereby the third shift register output and fourth shift register output are utilized to control the oscillator clock signal, and
   a microprocessor for receiving the oscillator clock signal.

8. A system as recited in claim 7, further comprising:
   an AND gate for receiving as inputs the first shift register output and the second shift register output, the AND gate providing an output to clear at least one of said first and second shift registers.

9. A system as recited in claim 7, further comprising:
   an up-down counter for receiving the third shift register output as an up-down control input and for receiving the fourth shift register output as a clock signal, the up-down counter providing a counter output for controlling the oscillator.

10. A system as recited in claim 9, further comprising an oscillator, the oscillator for receiving the counter output and for generating the oscillator clock signal in response thereto.

11. An integrated circuit for generating an oscillator clock signal based on a reference clock signal, comprising:
    an oscillator for generating the oscillator clock signal;
    a phase detector for receiving the oscillator clock signal and the reference clock signal, said phase detector providing a pair of outputs;
    a first shift register for receiving the pair of outputs generated by the phase detector, the shift register providing a first shift register output;
    a second shift register for receiving as a first input the reference clock signal and for receiving as a second input the oscillator clock signal, one of the first and second inputs being phase shifted, the second shift register providing a second shift register output;

an up-down counter receiving as a line control the first shift register output, the up-down counter receiving as a clock signal the second shift register output, the up-down counter generating an up-down control signal; and an oscillator control circuit for receiving the pair of outputs from the phase detector and the up-down control signal, said oscillator control circuit for controlling the oscillator frequency in response thereto.

12. An integrated circuit as recited in claim 11, wherein the reference clock is phase shifted as the first input to the second shift register.

13. An integrated circuit as recited in claim 12, wherein the reference clock signal is shifted to be a quadrature signal.

14. An integrated circuit as recited in claim 11, wherein the first input to the second shift register is phase shifted to be a quadrature signal.

* * * * *